United States Patent
Riga et al.

[11] Patent Number: 5,818,042
[45] Date of Patent: Oct. 6, 1998

[54] APPARATUS FOR CREATING THREE-DIMENSIONAL PHYSICAL MODELS OF CHARACTERISTICS OF MICROSCOPIC OBJECTS

[75] Inventors: Giorgio Riga, Palo Alto; Richard D. Mundy, Aptos; Mario A. Nobre, Sunnyvale, all of Calif.

[73] Assignee: Macrorepresentation, Inc., Santa Clara, Calif.

[21] Appl. No.: 898,383

[22] Filed: Jul. 22, 1997

Related U.S. Application Data

[63] Continuation of Ser. No. 496,514, Jun. 29, 1995, abandoned, which is a continuation of Ser. No. 109,026, Aug. 18, 1993, abandoned, which is a continuation of Ser. No. 867,153, Apr. 10, 1992, abandoned.

[51] Int. Cl.$^6$ .................................................... H01J 37/00
[52] U.S. Cl. ........................................... 250/306; 250/307
[58] Field of Search .................................... 250/306, 307, 250/311; 364/474.05

[56] References Cited

U.S. PATENT DOCUMENTS

| | | | |
|---|---|---|---|
| 4,436,684 | 3/1984 | White ........................................ | 264/219 |
| 4,575,330 | 3/1986 | Hull ........................................... | 425/162 |
| 4,575,805 | 3/1986 | Moermann et al. ................... | 364/474.05 |
| 4,742,464 | 5/1988 | Duret et al. ........................... | 364/474.25 |
| 4,945,032 | 7/1990 | Murphy et al. ........................ | 425/174 |
| 4,961,154 | 10/1990 | Pomerantz et al. ................... | 425/174.4 |
| 5,031,120 | 7/1991 | Pomerantz et al. ................... | 425/174 |
| 5,047,633 | 9/1991 | Finlan et al. ........................... | 250/306 |
| 5,134,569 | 7/1992 | Masters .................................. | 425/162 |
| 5,301,117 | 4/1994 | Riga ....................................... | 364/474.05 |

*Primary Examiner*—Bruce Anderson
*Attorney, Agent, or Firm*—D'Alessandro & Ritchie

[57] ABSTRACT

Apparatus for creating scaled three-dimensional physical models of characteristics of microscopic objects, includes a transducer apparatus including a transducer for creating first electrical signals representative of the magnitude of a physical characteristic of the microscopic object at a selected point within a selected area thereof, the first electrical signals having a first component defining said selected point and a second component related to the magnitude of the physical characteristic, a material shaping apparatus configured to create a physical model in a workspace, the workspace having an area related to the selected area of the microscopic object by a first selected scale factor, the material shaping apparatus including apparatus responsive to second electrical signals representing x, y, and z co-ordinates in the workspace for directing the formation of the physical model; and control apparatus, connected to the transducer apparatus and the material shaping apparatus, for converting the first electrical signals from the transducer to the second electrical signals and supplying the electrical signals to the material shaping apparatus, the control apparatus processing the first electrical signals according to the first and second selected scale factors.

8 Claims, 2 Drawing Sheets

APPARATUS FOR CREATING THREE-DIMENSIONAL PHYSICAL MODELS OF CHARACTERISTICS OF MICROSCOPIC OBJECTS

CROSS-REFERENCE TO RELATED APPLICATIONS

This s a file-wrapper continuation of patent application Ser. No. 08/496,514, filed Jun. 29, 1995, abandoned which is a continuation of Ser. No. 08/109,026, filed Aug. 18, 1993, abandoned which is a file-wrapper-continuation application of Ser. No. 07/867,153, filed Apr. 10, 1992 abandoned.

BACKGROUND OF THE INVENTION

1. Field of the Invention

The present invention relates to the field of model making and in particular to the field of automated modeling of selected characteristics of microscopic objects. More particularly, the present invention relates to apparatus and methods for creating selectably-scaled three-dimensional physical models of select characteristics of microscopic objects.

2. The Prior Art

The art of model making is old and well developed. Numerous techniques have been developed for preparing physical models of macroscopic objects. These techniques range from manual carving, casting, sculpting or other shaping of physical materials to create replicas of original objects to material shaping techniques involving differing degrees of automation. It is also possible to make physical objects from computerized data representing those objects. Examples of prior art model making techniques are disclosed in U.S. Pat. No. 3,213,757 to Cardwell; U.S. Pat. No. 4,436,684 to White; U.S. Pat. No. 4,663,720 to Duret et al.; U.S. Pat. No. 4,742,464 to Duret et al.; U.S. Pat. No. 4,939,646 to Essinger et al.; and U.S. Pat. No. 5,007,936 to Woolson.

Modelling of the physical characteristics, such as shape, density, conductivity, surface-temperature profile, and other physical characteristics of microscopic objects presents a set of problems different from those encountered in modelling of macroscopic objects. Obviously, the inability to directly view the microscopic object to be modelled contributes to the difficulty of the modelling process. Techniques, such as lost object casting are plainly unavailable for microscopic objects and objects having atomic and molecular dimensions.

It is currently possible to provide two-dimensional representations of microscopic objects and objects having atomic and molecular dimensions by using techniques such as scanning electron microscopy (SEM), scanning infra-red microscopy, scanning tunneling microscopy (STM), and atomic force microscopy (AFM). With these technologies, researchers have been able to view two-dimensional representations of microscopic objects and objects having atomic and molecular dimensions as images on computer screens and as hard copy computer printouts. Three-dimensional representations can be simulated by providing perspective views on such two-dimensional media.

Creation of physical models of characteristics, such as physical volume, of microscopic objects and objects having atomic and molecular dimensions, has heretofore been a manual process. Model makers may form magnified-scale representations of such objects from the two-dimensional representations available from computer screens and printouts. Techniques, such as lost object casting, are not available for modelling microscopic objects.

BRIEF DESCRIPTION OF THE INVENTION

Apparatus is provided according to the present invention for creating scaled three-dimensional physical models of characteristics of microscopic objects. According to the presently preferred embodiment, the apparatus includes a transducer apparatus including a transducer for creating first electrical signals representative of the magnitude of a physical characteristic of the microscopic object at a selected point within a selected area thereof. The first electrical signals have a first component defining the selected point and a second component related to the magnitude of the physical characteristic at that point.

The present invention also includes a material-shaping means. The material shaping means may be, for example, a CNC milling machine configured to mill a workpiece placed in a workspace, the workspace having an area related to the selected area of the microscopic object by a first selected scale factor. Alternately, the material shaping means may comprise technologies such as stereolithography employing laser polymerization of liquid media. The material-shaping means is responsive to second electrical signals for forming the model.

Control apparatus is connected to the transducer apparatus and the material-shaping means, and converts the first electrical signals from the transducer to the second electrical signals. The control apparatus processes the first and second components of the first electrical signals and may alter them according to user selectable scale factors and other parameters. The second electrical signals are then provided to the material-shaping means.

The present invention may also include three-dimensional animation display apparatus and accompanying software, such as CADCAM software, which may be used to manipulate the image of the object, for instance, by rotating it about one or more of the three positional axes. The control apparatus may provide electrical signals describing the manipulated image to the material shaping means.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
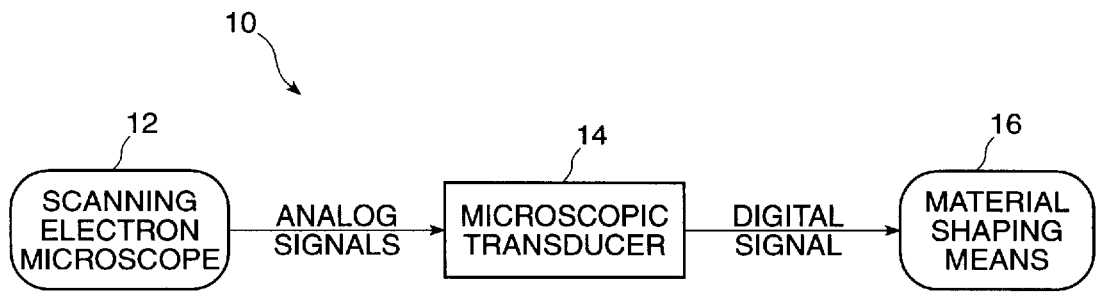
FIG. 1 is a block diagram of an apparatus according to the present invention.

Referring first to FIG. 1, a block diagram of an apparatus 10 according to the present invention includes a transducing means 12 for converting information about the position and magnitude of a selected physical characteristic of a microscopic object or object having atomic and molecular dimensions. Transducing means 12 may comprise an apparatus such as a scanning electron microscope, scanning infra-red microscope, scanning tunneling microscope, atomic force microscope, and other similar devices.

In principle, according to the present invention, such transducing apparatus may include any apparatus which is capable of converting a physical characteristic of a microscopic object or object having atomic and molecular dimensions, such as its height, into an electrical signal. Those of ordinary skill in the art will recognize that characteristics other than height, such as temperature, conductivity, current flow, density may be modelled according to the principles of the present invention depending on the choice of the transducer technology to be employed.

Transducer 12 produces an electrical signal which is related to the magnitude of the physical characteristic and also produces signals related to the positions of the transducer 12 over a selected area of the microscopic object or object having atomic and molecular dimensions at which the measurement of the characteristic was made. Typical transducers, such as the scanning electron microscope, scanning infra-red microscope, scanning tunneling microscope, and atomic force microscope, use scanning techniques to produce first output signals in cartesian coordinate form. These signals represent a physical characteristic, i.e., extent of the object in a direction along a z axis, and second output signals which identify the x and y axis positions of the transducer. Those of ordinary skill in the art will readily appreciate that transformation from one set of coordinates, such as cartesian coordinates, to a second set of coordinates, such as polar coordinates, is well within the level of ordinary skill in the art and is within the scope of the present invention.

For purposes of illustration only, the operation of the present invention will be disclosed in terms of modelling the physical dimensions of a microscopic, molecular or atomic sample, where the first and second output signals from the transducing means 12 comprise the z axis extent or height information of the sample at the point on the sample defined by the signal corresponding to the x and y axis positions on the sample. Those of ordinary skill in the art will readily recognize that, according to the nature of transducer 12, the z information from the sample can correlate to a physical characteristic of the sample other than its height.

The signals from transducer 12 are received by signal processing unit 14, where they are converted to a form suitable for driving material shaping means 16. Signal processing unit 14 may comprise a general purpose computing device such as a personal computer.

The portion of the present invention which actually creates the physical model in response to the electrical signals created by the transducing means 12 is a material-shaping means 16. There are several types of material shaping means known in the art. A first example of a well known material shaping means is a three-axis material shaping tool, which will referred to herein as CNC milling machine. There are numerous commercially available computer-controlled three-axis milling machines, such as the ones manufactured and marketed by Kiwa U.S.A. of Santa Fe Springs, Calif., Machinist CNC Mills, or Shizuoka/Bandit marketed by SK Systems, Inc., of Huntington Beach, Calif. There are numerous other manufacturers of similar equipment which will function adequately in the present invention. The CNC milling machine is driven by output signals from signal processing apparatus 14 in a manner well known in the art.

Another type of material shaping means 16 suitable for use in the present invention comprises a class of apparatus known as stereolithography apparatus. Such apparatus is capable of converting information from CAD files in a computer to a solid three-dimensional object by solidifying liquid polymers exposed to a laser beam or ultraviolet radiation. Examples of such systems are illustrated in U.S. Pat. No. 4,575,330 to Hull, U.S. Pat. No. 4,929,402 to Hull, U.S. Pat. No. 4,996,010 to Modrek, U.S. Pat. No. 4,999,143 to Hull et al. and U.S. Pat. No. 5,015,424 to Smalley. These patents are expressly incorporated herein by reference. Stereolithography apparatus is presently commercially available. Examples of such equipment include apparatus identified as models SLA 190, SLA 250, and SLA 500, available from 3-D Systems, Inc., of Valencia, Calif. Such equipment is compatible with many commercially available CAD software packages for which already-defined interfaces are presently available.

Figure 2:
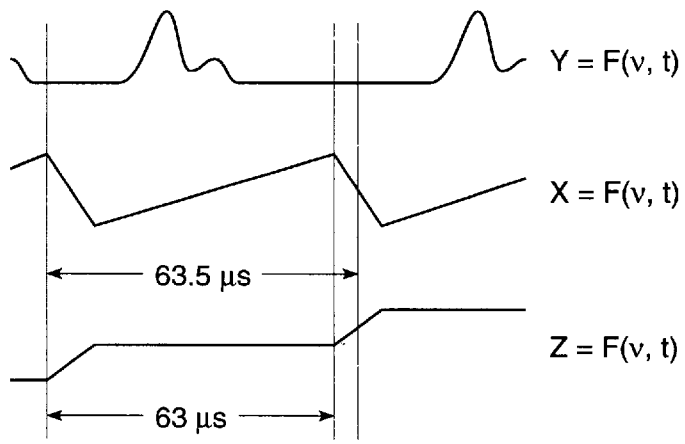
FIG. 2 is a diagram showing the x, y, and z components of an analog output signal from a typical scanning electron microscope (SEM).

The signals produced by the transducer 12 are typically originated as analog signals. FIG. 2 shows a typical representation of analog output signals from an SEM apparatus, where the y signal represents the height profile of the sample and the x and z signals represent scanning position. As can be seen from FIG. 2, the sawtooth and stairstep shapes of the x and z signals indicate that the x signal controls the scanning of a line and the z signal controls the position of the scan line. These analog output signals from transducer 12 may be converted to digital form suitable for easy manipulation by data processing elements, such as microprocessor and other computer systems. Some transducer equipment provides for internal digital conversion of analog signals to digital signals, while other such equipment provides output signals in analog form.

Commercially available scanning electron microscope, scanning infra-red microscope, scanning tunneling microscope, and atomic force microscope systems are well known in the art. Illustrative examples include equipment manufactured and marketed by a number of manufacturers, including, for example, Park Scientific Instruments of Mountain View Calif., Digital Instruments, Inc., of Santa Barbara, Calif., and Hitachi, Ltd. of Tokyo, Japan.

Figure 3:
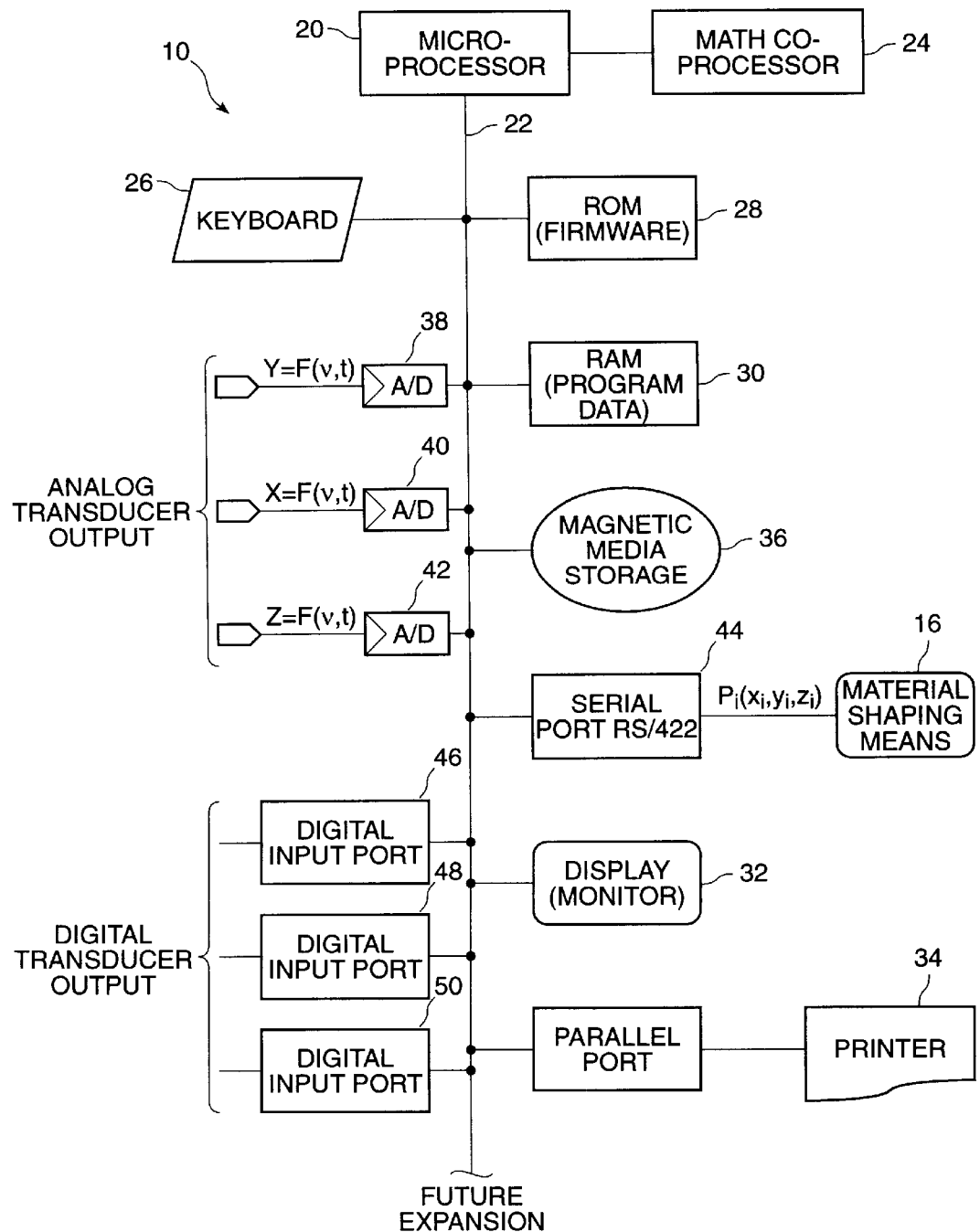
FIG. 3 is an expanded block diagram of a presently preferred embodiment of the apparatus of FIG. 1, showing the components of the signal processing apparatus in greater detail.

Referring now to FIG. 3, a more detailed diagram of a signal processing apparatus 14 suitable for use with the present invention is shown. The purpose of signal processing apparatus 14 is to accept the digital output signals from transducer 12, provide non-volatile storage for them, provide the processing resources necessary to modify them by desired scaling factors and to otherwise manipulate them, and to provide them to the apparatus which will create the physical models. Signal processing apparatus 14 may comprise a dedicated microprocessor controlled processor, a general purpose computing device such as a workstation, personal computer or larger system, or similar device provided with appropriate software. Signal processing apparatus 14 includes processor 20, coupled to bus 22. As will be appreciated by those of ordinary skill in the art, a math co-processor 24, may be employed to speed up the processing of data. Other devices, such as data entry keyboard 26, program store ROM memory 28, RAM memory 30, display device 32, printer 34, and magnetic, optical, or other mass storage device 36 may be coupled to processor 20 via bus 22. The configuration and operation of such devices is well known to those of ordinary skill in the art and will not be discussed in detail here.

Analog converters 38, 40, and 42 have their analog inputs coupled to the sources of analog output signals x, y, and z from transducer 12 and their analog outputs connected to bus 22. Depending on the desired resolution, A/D converters 38, 40, and 42 may be chosen to produce a selected number of digital output bits. It is presently believed that 8 bit resolution will be satisfactory for the purposes of the present invention, but higher resolution may be preferable for certain applications. A conventional data-acquisition software routine may be invoked to capture data from transducer 12 for manipulation by signal processing apparatus 14. There are numerous available commercial data-acquisition software products which may be used for this purpose.

Alternatively, one of a number of commercially available data-acquisition systems may be employed for capturing and digitizing the analog data. Examples of such systems include the PCIP Scope 10 MHz dual-channel sampling digital osciloscope AT bus board available from Keithley Metrabyte of Taunton, Mass., or a model 2232 digital oscilloscope with an option 12 RS-232 interface, available from Tektronix of Beaverton, Oreg. Data acquisition systems such as these are capable of acquiring data at speeds compatible with the output signal rate of the transducer with which they are to be used.

I/O interface 44, which may comprise a serial port such as an RS-232 or similar link, is used to connect bus 22 to material shaping means 16. Provision of such I/O interface elements is a task well within the level of ordinary skill in the art and the nature of the interface is defined by specifications supplied by the CNC milling machine manufacturer or stereolithography apparatus manufacturer.

Those of ordinary skill in the art will recognize that some transducers of the type referred to herein which may be incorporated into the present invention produce digital output signals which may be directly written to RAM memory 30 across bus 22 through conventional input ports. Three of such conventional input ports are illustrated at reference numerals 46, 48, and 50. For example, one transducer known to the inventor, an atomic force microscope marketed as Nanoscope by Digital Instruments of Santa Barbara, Calif., produces a digital output signal having a first format word defining a pixel area followed by individual data bytes of pixel data arranged in row and column order.

According to the present invention, a conventional data acquisition routine is invoked to capture the transducer output data into the RAM memory 30. The nature of the particular data-acquisition routine employed in any particular embodiment of the present invention depends solely on the particular transducer, the form (i.e., analog or digital) and timing of its output signals, and the nature of the bus interface, including A/D converter devices or data acquisition system devices, which are employed. In the case of commercially available data acquisition system devices, such as the illustrative examples given above, those of ordinary skill in the art will understand that the documentation supplied with such systems provides the information necessary to enable a skilled programmer to compose the line by line code as a routine exercise, but in any event the composition of a software routine to accomplish such data acquisition and map it into RAM memory 30 is well within the level of ordinary skill in the art. Generally, the acquired parameter values (i.e. height at selected points on the object) from the transducer output signal may be mapped into memory locations defined by the location-specifying data portion of the transducer output signal, thus simplifying the subsequent task of manipulating the data.

There are several basic operations of the apparatus of the present invention which may be variously combined to yield several operating modes. The first operation is the capture by signal processing apparatus 14 of information from transducer 12 regarding the characteristic of the sample. As previously stated, numerous conventional data acquisition routines may be employed for this purpose by those of ordinary skill in the art.

The second operation which may be performed by the apparatus of the present invention is a data manipulation operation by which the data may be manipulated according to scaling information or other information, such as manipulation via a software application such as a three-dimensional CAD type utility invoked by the system user. Those of ordinary skill in the art will recognize that there are numerous commercially available CADCAM software programs which may be utilized in connection with the present invention. According to a presently preferred embodiment, the CAD data may be presented in a format which conforms to the Programmer's Hierarchical Interactive Graphics Standard (PHIGS) ANSI standard. This standard is described in "Understanding PHIGS" published by Template, Megatek Corp., of San Diego, Calif.

The data manipulation operation may also include a storage operation in which the input data, the manipulated data, or both, are stored for later use in a device such as mass storage device 36. Storage routines of this nature are well understood. Use of CADCAM software for manipulation of object representations is presently a routine task, and many software packages are commercially available.

Finally, a driving operation uses the manipulated data to drive the material shaping means 16 to produce the three-dimensional model of the characteristic of the microscopic object or object having atomic and molecular dimensions. The particular line by line software code employed for the driving operation in any actual system according to the present invention will depend on the stereolithography apparatus or CNC machine and controller employed. There are currently several controller formats used in the industry. For example, the Bandit®1 CNC controllers use a programming format described in the publication BDT1-5.2.3 "Bandit 1 CNC For Mill System" Programming Manual, available from the Allen Bradley Company. Other similar CNC controller manufacturer literature and programming guides disclose the programming language and syntax to be used with other CNC controllers. For embodiments which will employ a stereolithography apparatus as the material shaping means, those of ordinary skill in the art will understand that interface software for driving such apparatus is commercially available from numerous CADCAM software vendors. Information concerning compatible CAD/CAM software packages and interfaces for driving stereolithography equipment vendors, such as 3-D Systems, Inc., of Valencia, Calif.

Scaling information maybe combined with the transducer output information to define a model having a selected size. For example, if an 8 bit format is employed, x and y values of 00H may be used to specify the first scanned point and the x and y values of FFH may be used to specify the last scanned point in a 256×256 matrix of a microscopic or atomic sized object in transducer 12. Similarly, Z values in the range 00H to FFH specify heights of from a minimum to a maximum height of such an object. By multiplying the x and y values by selected scaling factors, the maximum distances FFH on the x position axis and FFH on the y position axis can be independently scaled to translate to any portion of the x and y bed travel distances of the CNC machine to create objects with a different scale factor. The same scaling principles can be applied to the z axis control of the milling cutter. When using equipment, such as stereolithography equipment, scaling can be accomplished directly through the CAD/QAM software which is used to drive the equipment.

The capture operation may be combined with the driving operation for material shaping means 16 for an "on the fly" operating mode. In this mode of operation, the output signals from transducer 12 are taken into signal processing apparatus 14, are manipulated according to scaling information provided by the user via keyboard input device 26, and are converted to output signals immediately used to drive material shaping means 16.

Alternatively, the capture operation may be performed alone or in conjunction with the data manipulation operation, and the input data and/or manipulated data may be stored in mass storage device 36. A driving operation to create the three-dimensional model may be performed at a later time using the data retrieved from storage. Those of ordinary skill in the art will recognize that in yet another mode of operation of the apparatus of the present invention, the original input data may be stored and the manipulation operation and the driving operation may be performed at a later time either together or separately.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. Apparatus for creating a scaled three-dimensional physical model of characteristics of a microscopic object over a selected area thereof, including:

transducer means for creating first electrical signals representative of the magnitude of a characteristic of said microscopic object at a selected point within said selected area, the first electrical signals having a first component defining said selected point and a second component related to the magnitude of said characteristic;

a material shaping means configured to create said physical model in a volume defining a workspace, said material shaping means responsive to second electrical signals representing selected locations within the volume of said workspace for shaping said physical model at said selected locations in the volume of said workspace; and control means, connected to said transducer apparatus and said material shaping means, for converting said first electrical signals from said transducer means to said second electrical signals and supplying said second electrical signals to said material shaping means.

2. The apparatus of claim 1, further including storage means, responsive to said control means, for providing non-volatile storage of said first electrical signals relating to at least one microscopic object.

3. The apparatus of claim 1 wherein said transducer means comprises an apparatus selected from the group consisting of an atomic force microscope, a scanning electron microscope, and a scanning tunneling microscope.

4. The apparatus of claim 1 wherein said control means includes means for selectively scaling said first electrical signals by selected scale factors.

5. The apparatus of claim 1 wherein said material shaping means is a CNC milling machine.

6. The apparatus of claim 1 wherein said material shaping means is a stereolithography apparatus.

7. A method for creating a scaled three-dimensional physical model of characteristics of a selected area of a microscopic object, including the steps of:

scanning said object to produce first electrical signals related to the magnitude of a characteristic of said microscopic object at a selected point within said selected area;

converting said first electrical signals to second electrical signals compatible with a material shaping means; and supplying said second electrical signals to said material shaping means.

8. A method for creating a scaled three-dimensional physical model of characteristics of a selected area of a microscopic object, including the steps of:

scanning said object to produce first electrical signals related to the magnitude of a characteristic of said microscopic object at a selected point within said selected area;

converting said first electrical signals to second electrical signals compatible with a CNC milling machine;

placing a workpiece from which said model will be machined on the workbed of a CNC milling machine; and supplying said second electrical signals to said CNC milling machine.

* * * * *